United States Patent
Knecht et al.

[11] Patent Number: 6,066,989
[45] Date of Patent: May 23, 2000

[54] FREQUENCY SYNTHESIZER MODULE FOR DUAL BAND RADIO

[75] Inventors: Thomas A. Knecht, West Dundee; Iyad Alhayek, Schaumburg; Jeffrey Dykstra, Palatine, all of Ill.

[73] Assignee: CTS Corporation, Elkhart, Ind.

[21] Appl. No.: 09/217,156

[22] Filed: Dec. 21, 1998

[51] Int. Cl.[7] .............................. H03L 1/02; H03L 7/06; H03L 7/099; H03L 7/16
[52] U.S. Cl. .............................. 331/18; 331/16; 331/66; 331/68; 455/259; 455/260
[58] Field of Search ............................ 331/1 A, 10, 16, 331/18, 25, 36 C, 66, 68, 69, 116 R, 116 FE, 108 D, 158, 177 V; 327/105–107, 156–159; 375/376; 455/259, 260

[56] References Cited

U.S. PATENT DOCUMENTS 5,126,699  6/1992  Kabler ...................................... 332/124

*Primary Examiner*—David Mis

[57] ABSTRACT

A frequency synthesizer module with temperature compensation of a crystal oscillator circuit frequency controlled by a varactor. A module memory contains information characterizing a temperature dependency of a crystal which is applied to the varactor to temperature compensate the crystal in response to a temperature sensor signal. The module includes at least one locked loop circuit including a loop filter, at least one associated frequency divider, and a switchable dual band voltage controlled oscillator. The crystal oscillator is coupled to the at least one locked loop circuit and the frequency of the crystal is controlled by the memory via the varactor such that a temperature compensated output frequency is provided by the module.

18 Claims, 3 Drawing Sheets

FREQUENCY SYNTHESIZER MODULE FOR DUAL BAND RADIO

FIELD OF THE INVENTION

The present invention relates generally to frequency synthesizers used in conjunction with piezoelectric frequency oscillators in a multi-channel radio and, in particular, to a frequency synthesizer with temperature compensation.

BACKGROUND OF THE INVENTION

Frequency synthesizers have typically been provided with reference frequency signals from crystal controlled frequency oscillators having temperature compensation circuits for use in frequency stabilized radio communications. These compensation circuits may be composed of analog or digital devices and are used to provide a relatively flat frequency output over temperature. Typically, a capacitive element is provided to allow absolute adjustment of the final frequency of the oscillator. This capacitive element is generally either in the form of a trim capacitor or an analog varactor controlled by an applied DC voltage. By adjusting this capacitance, the user is able to adjust (warp) the oscillator onto a desired frequency.

A typical radio application includes at least one RF local oscillator. The more sophisticated local oscillators consist of a frequency synthesizer which can include a temperature compensated crystal oscillator (TCXO) coupled to a phase locked loop (PLL) which includes a voltage controlled oscillator (VCO) and a loop filter. Furthermore, in one of today's dual band radios, one can find a second VCO and possibly a second PLL. Moreover, additional PLLs can be used for separate RF and IF functions in the radio.

In typical frequency synthesizer applications multiple discrete elements are soldered to a circuit board to make up a functioning frequency synthesizer. These numerous elements presently take up a considerable amount of circuit board space in the radio. It would be advantageous to provide a frequency synthesizer that takes up much less circuit board space. In particular, it would be very beneficial to provide a dual band frequency synthesizer without the circuit board clutter of multiple discrete components and without the multiple affixing processes needed for these components.

There have been prior art attempts to integrate frequency synthesizers on a silicon chip, however these prior art devices fail to integrate the entire function of the frequency synthesizer in one device as some of the needed components to make the synthesizer function can not be integrated. A first prior art circuit includes a fractional-N phase lock loop and modulator/demodulator on a single integrated circuit. However, this device does not include an on-board TCXO or VCO. A second prior art circuit includes a frequency synthesizer and a gain block portion of a VCO. However, this device does not include an on-board crystal or the tank circuit for the VCO.

Therefore, there is a need for a stand alone frequency synthesizer which: is modularized to provide a single component for the radio designer, is temperature compensated, achieves equivalent or better performance than prior art frequency synthesizers; is easily controlled by a single data bus, and has all necessary on-board components. In addition, it is desirable to provide a low cost, small sized, low current drain frequency synthesizer that allows control of the temperature compensation of the crystal oscillator while providing low phase noise.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

The present invention provides a stand-alone frequency synthesizer module for dual band radio applications. The module is a single component which provides a size, cost and assembly advantage for the radio designer. In addition, the module is temperature compensated and achieves equivalent or better performance than prior art frequency synthesizers. All the functions of the module are easily controlled by a single data bus. Optionally, the module includes a power sleep mode to reduce current drain. A preferred embodiment allows control of the temperature compensation of the crystal oscillator while providing low phase noise. The present invention solves the problems of circuit board clutter and extra processing by advantageously providing a stand alone frequency synthesizer module that takes up much less circuit board space in a radio.

Figure 1:
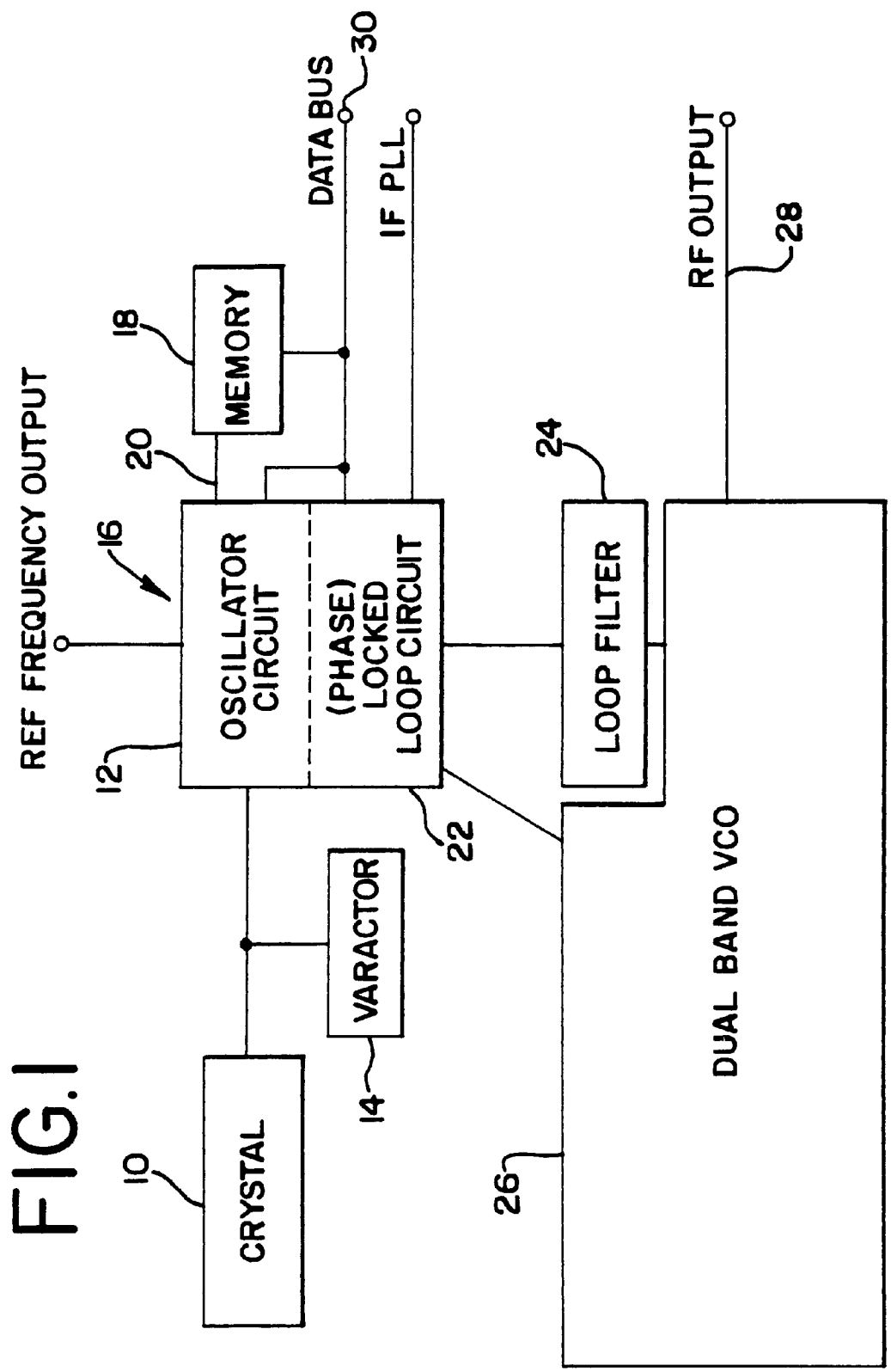
FIG. 1 shows a simplified block diagram of a temperature compensated frequency synthesizer module, in accordance with the present invention.

FIG. 1 shows a simplified block diagram of a temperature compensated frequency synthesizer module, in accordance with the present invention. In this apparatus, a piezoelectric crystal 10 is operated at a resonant frequency by a connected oscillator circuit 12. Preferably, the oscillator circuit 12 is integrated on a portion of an integrated circuit (IC) 16. The crystal 10 and oscillator circuit 12 together form a major portion of a crystal oscillator circuit. Preferably, the crystal oscillator is of a Pierce design which is known in the art. However, other designs may be used equally well.

The operating frequency of the crystal oscillator circuit is controllable by a reactive load such as a varactor 14, or other variable capacitive element coupled to the crystal 10, which is responsive to a control voltage applied from the IC 16. The varactor diodes provide a low cost method of providing variable reactance. However, other tunable reactive load elements available in the art, such as voltage variable capacitors (VVCs), may be used successfully in the present invention. The capacitance of the varactor 14 loads the crystal 10 so as to change its operating frequency. The varactor 14 thereby provides the means to compensate the natural temperature variation of the crystal operating frequency over temperature.

A memory 18 contains information characterizing a temperature dependency of the crystal 10. Many available memory devices may be used, such as digital signal processors, PROM, EPROM, EEPROM, SRAM, DRAM, digital-to-analog converters, flash memory, DSP, microcontroller, and the like. It is preferred that an EEPROM be used for the memory 18. The memory 18 is programmed with predetermined digital data which substantially corresponds to an inverse function of the frequency deviations of the crystal 10 over temperature. For an AT-cut crystal, which is preferred, the inverse function corresponds to the well known Bechmann curve, which can be well characterized by a third or higher nth-order polynomial expansion. A fourth order expansion is preferred for its additional accuracy in characterizing the Bechmann curve. However, higher order best-fit polynomials (n 7) will provide greater accuracy.

In operation, the polynomial coefficients of the Bechmann curve are calculated for each crystal 10 and these values are programmed into the memory 18. Alternatively, the memory 18 may be programmed with a look-up table of actual frequency deviations of the crystal 10 over discrete temperature ranges which may be called up and applied to the varactor 14. In this case, the information in the look-up table would correspond to a signal provided by a temperature sensor (not shown) to the memory 18.

The temperature sensor, preferably a cascaded diode string, is integrated on the IC 16. The temperature sensor may also be provided by a thermistor or a transistor. Of these, the diode string is the lowest cost. Thermistors typically have manufacturing tolerance variations from lot to lot, and unit to unit. A diode string that is integrated is substantially exactly matched in geometry and current flow. The temperature varying voltage across the diode string corresponds to an ambient temperature. The information in the memory 18 is converted into a correction voltage signal and is applied to the varactor 14 through the integrated circuit to compensate for changes in the frequency of the crystal 10 in response to a signal from the temperature sensor.

Typically, the temperature sensor is located in proximity to the crystal 10 to reduce errors which may arise due to temperature gradients across the frequency synthesizer module. The temperature sensor provides a temperature indicating signal 20 to the memory 18 which directs the memory 18 to look-up the crystal compensation data in the memory 18 that corresponds to the voltage across the temperature sensor. The memory 18 then directs the IC 16 to provide a corresponding correction voltage to the varactor 14 to change its capacitance. The varactor 14 is coupled to the crystal oscillator circuit such that a change in capacitance will cause a corresponding change in the frequency of the crystal 10. In this way, the crystal oscillator circuit provides a relatively stable temperature compensated frequency output to couple to at least one locked loop circuit 22. The varactor 14 can also be driven to allow the adjustment of the nominal frequency of the crystal oscillator circuit to a particular output frequency.

The at least one locked loop circuit 22 can be a frequency locked loop or a delay locked loop, but is preferably a phase locked loop (PLL) and more preferable a fractional-N PLL. The at least one locked loop circuit 22 includes a loop filter 24, at least one associated frequency divider and phase detector as is known in the art, and a switchable dual band voltage controlled oscillator 26 which can consist of discrete components or be integrated.

A novel aspect of the present invention is having the oscillator circuit and the at least one locked loop circuit 22 integrated on the same IC 16. Optionally, any one or all of the memory 18, dual band VCO 26, and varactor 14 can be integrated onto the same IC 16.

Preferably, the loop filter 24 consists of non-integrated components to reduce the size and cost of the IC 16 and to lower noise, but the remainder of the locked loop circuit 22 is integrated on the IC 16. The crystal oscillator circuit is coupled to the at least one locked loop circuit 22 and an output frequency 28 of the voltage controlled oscillator 26 is controlled by data from a digital data bus 30 or the memory 18 being applied to the divider of the locked loop circuit 22. The divider can be based on approaches that perform fractional division, such as sigma-delta modulation, which are known in the art.

The crystal oscillator circuit being coupled to the at least one locked loop circuit 22 and the frequency of the crystal oscillator circuit being controlled by the memory 18 via the varactor 14 such that a temperature compensated frequency input is provided to the locked loop circuit 22 thereby providing a stable output frequency 28 from the module.

The digital data bus 30 of the present invention controls all of: a nominal operating frequency of the crystal oscillator circuit, the at least one frequency divider of the at least one locked loop circuit 22, the information in the memory 18, and band switching of the dual band voltage controlled oscillator 26. Preferably, the data bus 30 also control a power sleep mode of the module which advantageously conserves battery life of the radio.

Figure 2:
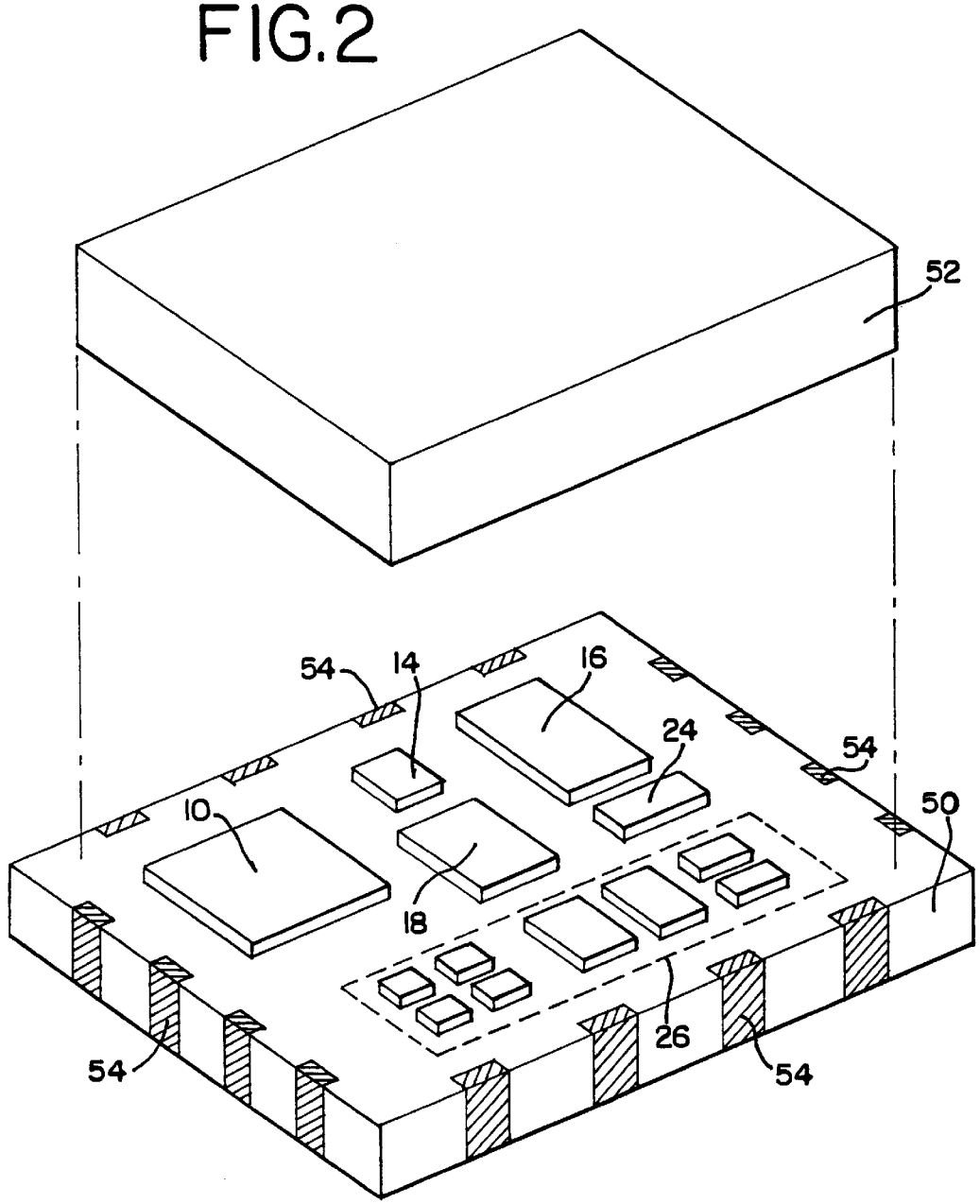
FIG. 2 shows a perspective view of packaging components for the module of FIG. 1, in accordance with the present invention.

FIG. 2 shows a package which completes the frequency synthesizer module of FIG. 1, whose description is hereby incorporated by reference. The package consists of a circuit board 50 and a lid 52. The package encloses all the circuitry of the module with electrical connection extending from the circuitry within the package to external input-output connections. Preferably, the package is surface mountable. More preferably, the circuit board 50 is planar and consists of one of the group of a ceramic, an epoxy resin, and a polyimide. It is also preferred that the lid 52 is metal and is soldered to the circuit board 50 to provide an RF shield. However, a ceramic lid can be used if desired.

Figure 3:
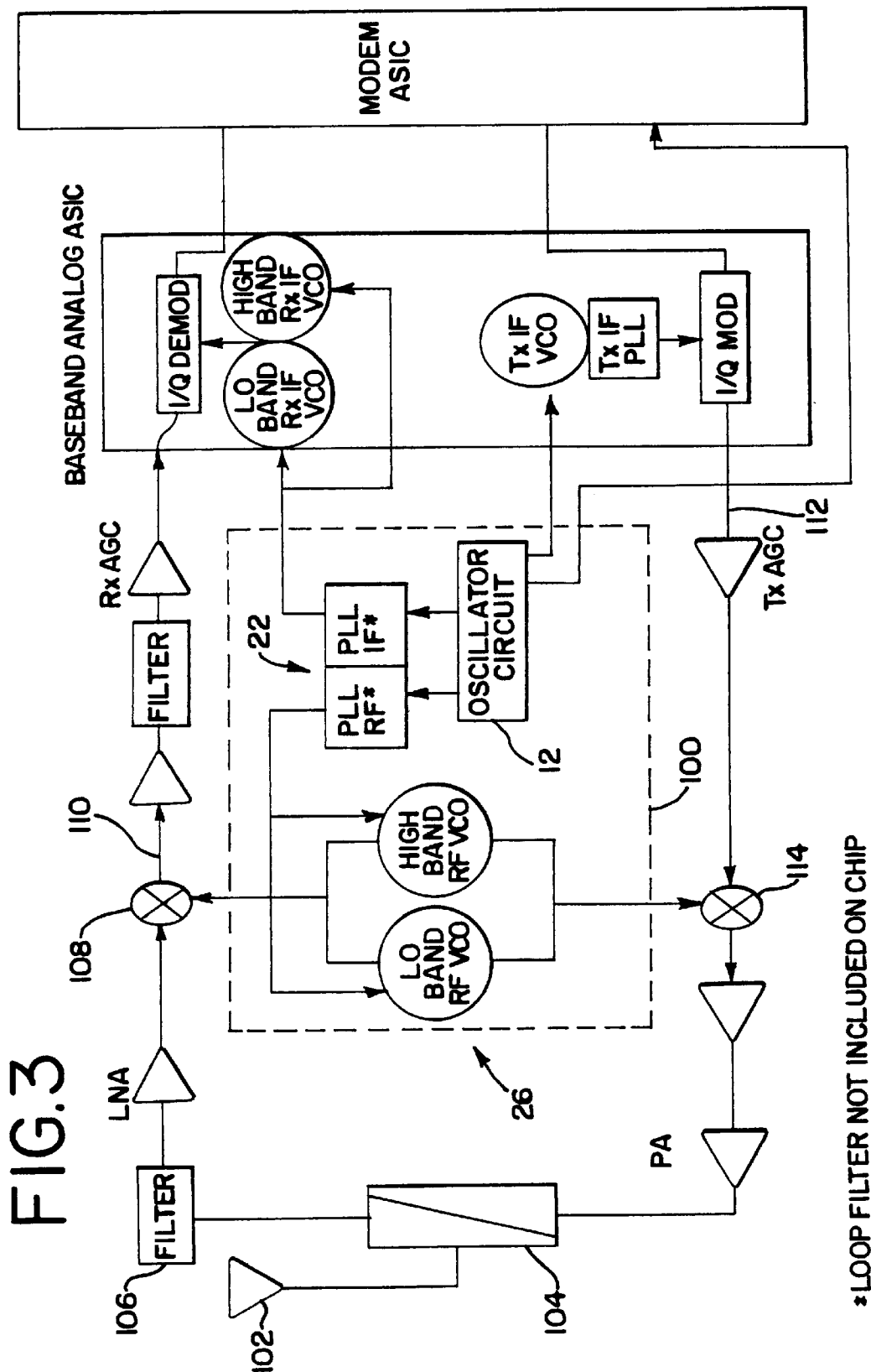
FIG. 3 shows a simplified schematic diagram of a radio communication device incorporating the module of FIG. 1, in accordance with the present invention.

FIG. 3 shows a general implementation of a radio communication device incorporating a frequency synthesizer module 100, in accordance with a preferred embodiment of the present invention. For simplification the crystal, varactor, memory, and loop filter are not shown, but it is to be understood that these devices are present and operate as described above and are hereby incorporated by reference.

In the preferred embodiment, the frequency synthesizer module 100 includes two PLLs, an RF PLL and an IF PLL. The RF PLL is preferably a fractional-N PLL. The LO and HIGH BAND RF VCO (comprising the dual band VCO 26) are switched by the radio. The radio includes an antenna 102 which feeds a duplexer 104 which is coupled to transmit and receiver circuits. The receiver circuit includes a preselect filter 106 coupled to a receiver mixer 108 through a low noise amplifier (LNA). The dual band VCO 26 feeds its signal to the receiver mixer 108. The translated signal 110 is subsequently fed through amplifiers, filters, and receiver AGC circuit to a baseband analog application specific integrated circuit (ASIC) as is known in the art. The IF PLL portion of the module 100 is also used to feed IF VCOs in the baseband ASIC to further demodulate the signal 110 which is subsequently fed to a modem ASIC which is also known in the art.

An outgoing signal from the radio originates in the modem ASIC and is fed to a transmit IF modulator in the baseband ASIC. The baseband ASIC has on onboard IF PLL so it is only necessary for the module 100 to supply a crystal oscillator 12 signal to the baseband ASIC. This modulated signal 112 is coupled to a transmit mixer 114 through a transmit AGC circuit. The dual band VCO 26 feeds its signal to the transmit mixer 108 to upconvert the signal 114 which is subsequently amplified before being transmitted to the antenna 102 through the duplexer 104.

The description of the radio has been simplified only as an example to particularly point out the features of the preferred embodiment of the present invention. The exemplification set out herein illustrates a preferred embodiment of the invention in one form thereof, and such exemplification is not intended to be construed as limiting in any manner.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A frequency synthesizer module with temperature compensation, comprising:

a crystal in a crystal oscillator circuit with a frequency that is controllable by a coupled varactor;

a memory containing information characterizing a temperature dependency of the crystal, the information being applied to the varactor to compensate for changes in the frequency of the crystal in response to a signal from a coupled temperature sensor; and at least one locked loop circuit chosen from the group consisting of a phase locked loop, a frequency locked loop and a delay locked loop, the at least one locked loop circuit includes a loop filter, at least one associated frequency divider, and a switchable dual band voltage controlled oscillator;

the crystal oscillator circuit being coupled to the at least one locked loop circuit and the frequency of the crystal oscillator circuit being controlled by the memory via the varactor such that a temperature compensated frequency is provided to the locked loop circuit thereby providing a stable output frequency from the module.

2. The frequency synthesizer module of claim 1, further comprising a digital data bus which controls all of: a nominal operating frequency of the crystal oscillator circuit, the at least one frequency divider of the at least one locked loop circuit, the information in the memory, and switching of the dual band voltage controlled oscillator.

3. The frequency synthesizer module of claim 1, wherein the at least one locked loop circuit is a fractional-N phase locked loop.

4. The frequency synthesizer module of claim 1, further comprising a package consisting of a circuit board and a lid, the package enclosing circuitry of the module with electrical connections extending from the circuitry within the package to external input-output connections.

5. The frequency synthesizer module of claim 4, wherein the package is surface mountable.

6. The frequency synthesizer module of claim 4, wherein the circuit board is planar and consists of one of the group of a ceramic, an epoxy resin, and a polyimide.

7. The frequency synthesizer module of claim 4, wherein the lid is metal and is soldered to the circuit board to provide an RF shield.

8. A dual band frequency synthesizer module with temperature compensation, comprising:

a crystal in a crystal oscillator circuit with a frequency that is controllable by a coupled varactor;

a memory containing information characterizing a temperature dependency of the crystal, the information being applied to the varactor to compensate for changes in the frequency of the crystal in response to a signal from a coupled temperature sensor;

an IF phase locked loop circuit and an RF phase locked loop circuit with a loop filter and a voltage controlled oscillator, each phase locked loop circuit including an associated frequency divider; and a digital data bus which controls all of: a nominal operating frequency of the crystal oscillator circuit, the divider of each phase locked loop circuit, the information in the memory, and switching of the dual band voltage controlled oscillator;

the crystal oscillator circuit being coupled to the phase locked loop circuits and the frequency of the crystal oscillator circuit being controlled by the memory via the varactor such that a temperature compensated frequency is provided to the phase locked loop circuits thereby providing a stable output frequency from the module.

9. The frequency synthesizer module of claim 8, wherein the phase locked loop circuits are fractional-N phase locked loop.

10. The frequency synthesizer module of claim 8, further comprising a package consisting of a circuit board and a lid, the package enclosing circuitry of the module with electrical connections extending from the circuitry within the package to external input-output connections.

11. The frequency synthesizer module of claim 10, wherein the package is surface mountable.

12. The frequency synthesizer module of claim 10, wherein the circuit board is planar and consists of one of the group of a ceramic, an epoxy resin, and a polyimide.

13. The frequency synthesizer module of claim 10, wherein the lid is metal and is soldered to the circuit board to provide an RF shield.

14. A radio communication device having an antenna feeding receiver and transmitter circuit through a duplexer, the radio communication device including RF and IF modulation and demodulation circuits and a frequency synthesizer module with temperature compensation, the frequency synthesizer module comprising:

a crystal in a crystal oscillator circuit with a frequency that is controllable by a coupled varactor;

a memory containing information characterizing a temperature dependency of the crystal, the information being applied to the varactor to compensate for changes in the frequency of the crystal in response to a signal from a coupled temperature sensor; and at least one locked loop circuit chosen from the group consisting of a phase locked loop, a frequency locked loop and a delay locked loop, the at least one locked loop circuit includes a loop filter, at least one associated frequency divider, and a switchable dual band voltage controlled oscillator;

the crystal oscillator circuit being coupled to the at least one locked loop circuit and the frequency of the crystal oscillator circuit being controlled by the memory via the varactor such that a temperature compensated frequency is provided to the locked loop circuit thereby providing a stable output frequencies from the module to receiver and transmitter RF mixers and to IF circuits in the radio communication device.

15. The radio communication device of claim 14, further comprising a digital data bus driven by the radio which controls all of: a nominal operating frequency of the crystal oscillator circuit of the frequency synthesizer module, the at least one frequency divider of the at least one locked loop circuit of the frequency synthesizer module, the information in the memory of the frequency synthesizer module, and switching of the dual band voltage controlled oscillator of the frequency synthesizer module.

16. The radio communication device of claim 14, wherein the at least one locked loop circuit of the frequency synthesizer module is a fractional-N phase locked loop.

17. The radio communication device of claim 14, wherein the frequency synthesizer module further comprises a package consisting of a circuit board and a metal lid, the package enclosing circuitry of the frequency synthesizer module with electrical connections extending from the circuitry within the package to external input-output connections to the radio, the metal lid providing an RF shielding for other circuits of the radio.

18. The radio communication device of claim 14, wherein the package of the frequency synthesizer module is surface mountable.

* * * * *